(12) United States Patent
Harada et al.

(10) Patent No.: US 7,356,917 B2
(45) Date of Patent: Apr. 15, 2008

(54) METHOD FOR MANUFACTURING MULTI-LAYER PRINTED CIRCUIT BOARD

(75) Inventors: Toshikazu Harada, Kariya (JP); Koji Kondo, Toyohashi (JP)

(73) Assignee: DENSO CORPORATION, Kariya (JP)

( * ) Notice: Subject to any disclaimer, the term of this patent is extended or adjusted under 35 U.S.C. 154(b) by 313 days.

(21) Appl. No.: 11/116,320

(22) Filed: Apr. 28, 2005

(65) Prior Publication Data

US 2005/0186406 A1 Aug. 25, 2005

Related U.S. Application Data

(62) Division of application No. 10/814,804, filed on Apr. 1, 2004, now Pat. No. 7,012,197.

(30) Foreign Application Priority Data

Apr. 4, 2003 (JP) .............................. 2003-101460

(51) Int. Cl.
*H05K 3/30* (2006.01)
*H05K 1/03* (2006.01)

(52) U.S. Cl. .................... 29/831; 29/830; 29/846; 29/851; 174/255; 361/794

(58) Field of Classification Search ............... 29/825, 29/829–831, 846, 847, 851, 852; 156/306.6, 156/311–313; 174/255, 258, 260, 262, 26, 174/263; 361/792–795, 751; 257/702
See application file for complete search history.

(56) References Cited

U.S. PATENT DOCUMENTS

| | | | |
|---|---|---|---|
| 4,893,404 A * | 1/1990 | Shirahata et al. ............. | 29/846 |
| 4,931,354 A | 6/1990 | Wakino et al. | |
| 5,103,293 A * | 4/1992 | Bonafino et al. ........... | 257/702 |
| 5,403,672 A | 4/1995 | Urasaki et al. | |
| 5,482,784 A | 1/1996 | Ohara et al. | |
| 5,800,575 A * | 9/1998 | Lucas ......................... | 29/830 |
| 6,228,467 B1 | 5/2001 | Taniguchi et al. | |
| 6,476,330 B2 | 11/2002 | Otsuka et al. | |
| 6,534,723 B1 | 3/2003 | Asai et al. | |

(Continued)

FOREIGN PATENT DOCUMENTS

JP  A-H07-307575  11/1995

(Continued)

OTHER PUBLICATIONS

Notice of Reason for Refusal from Chinese Patent Office issued on Sep. 19, 2006 for the corresponding Chinese patent application No. 200410034230.6 (a copy and English translation thereof).

(Continued)

*Primary Examiner*—Donghai D. Nguyen
(74) *Attorney, Agent, or Firm*—Posz Law Group, PLC

(57) ABSTRACT

A multi-layer printed circuit board includes an insulation substrate; a surface conductive pattern disposed on a surface of the insulation substrate; and an inner conductive pattern embedded in the insulation substrate. The surface conductive pattern has a surface roughness on an insulation substrate side, the surface roughness of the surface conductive pattern being larger than that of the inner conductive pattern.

3 Claims, 4 Drawing Sheets

U.S. PATENT DOCUMENTS

| | | |
|---|---|---|
| 6,630,629 B2 | 10/2003 | Otsuka et al. |
| 6,734,542 B2 | 5/2004 | Nakatani et al. |
| 7,071,424 B1 * | 7/2006 | Shirai et al. ............. 174/263 |
| 2001/0042637 A1 | 11/2001 | Hirose et al. |

FOREIGN PATENT DOCUMENTS

| | | |
|---|---|---|
| JP | A-2002-185132 | 6/2002 |
| JP | A-2002-232153 | 8/2002 |
| JP | A-2002-329959 | 11/2002 |
| JP | A-2003-046260 | 2/2003 |

OTHER PUBLICATIONS

Notice of Reason for Refusal from Japanese Patent Office issued on Jan. 30, 2006 for the corresponding Japanese patent application No. 2003-101460 (a copy and English translation thereof).

Notice of Allowability dated Oct. 5, 2005 in corresponding U.S. Appl. No. 10/814,804 (patent No. 7,012,197).

Second Office Action dated Aug. 17, 2007 in the corresponding Chinese patent application No. 200410034230.6 (and English translation).

* cited by examiner

METHOD FOR MANUFACTURING MULTI-LAYER PRINTED CIRCUIT BOARD

CROSS REFERENCE TO RELATED APPLICATION

This application is a divisional application of U.S. patent application Ser. No. 10/814,804, filed on Apr. 1, 2004, now U.S. Pat. No. 7,012,197, which is based on Japanese Patent Application No. 2003-101460 filed on Apr. 4, 2003, the disclosure of which is incorporated herein by reference.

FIELD OF THE INVENTION

The present invention relates to a multi-layer printed circuit board and a method for manufacturing the same. The multi-layer printed circuit board includes an insulation layer and a wiring layer formed of a conductive pattern, which are laminated alternately. Specifically, the present invention relates to a multi-layer printed circuit board suitably used for a high frequency circuit and a method for manufacturing the same.

BACKGROUND OF THE INVENTION

A multi-layer printed circuit board used for a high frequency circuit is, for example, disclosed in Japanese Patent Application Publication No. H01-120095 (i.e., U.S. Pat. No. 4,931,354). The multi-layer printed circuit board includes multiple insulation layers made of ceramics and multiple wiring layers having conductivity, which are laminated and integrated together. A cavity is formed between an upper surface and/or a sidewall of an inner conductive wiring layer and the insulation layer disposed on the inner conductive wiring layer.

Since the multi-layer printed circuit board includes the cavity formed between the upper surface and/or the sidewall of the inner conductive wiring layer and the insulation layer disposed on the inner conductive wiring layer, the total dielectric constant of the multi-layer printed circuit board is reduced. Therefore, high frequency properties of the multi-layer printed circuit board such as a delay of propagation of a signal are improved.

However, not only the dielectric constant of the insulation layer but also the surface roughness of the wiring layer affect the high frequency properties of the signal. Thus, the factor for affecting the high frequency properties of the signal is provided by the dielectric constant of the insulation layer and the surface roughness of the wiring layer. As the surface of the wiring layer becomes rough, the surface resistance of the wiring layer becomes larger. Therefore, the properties of a high frequency alternating current flowing through the wiring layer are deteriorated. Specifically, as the frequency of the high frequency alternating current becomes higher, the high frequency alternating current flows nearer the surface of the wiring layer because of a skin effect. Thus, the surface roughness of the wiring layer affects the high frequency properties largely.

Further, another multi-layer printed circuit board is, for example, disclosed in Japanese Patent Application Publication No. 2000-38464 (i.e., U.S. Pat. No. 6,228,467). The multi-layer printed circuit board includes an insulation layer and a wiring layer formed of a conductive pattern, which are laminated together. The multi-layer printed circuit board is manufactured as follows. Multiple conductive pattern films are prepared. The conductive pattern film includes a resin film made of thermoplastic resin and a conductive pattern made of copper foil. The conductive pattern is disposed on the resin film. These conductive pattern films are laminated in a predetermined order, and then, the laminated conductive pattern films are heated and pressurized at a predetermined temperature under a predetermined pressure. Thus, the resin films of the neighboring conductive pattern films are adhered and integrated together, so that the multi-layer printed circuit board is manufactured.

Since all multiple laminated conductive pattern films are adhered at the same time by heating and pressurizing, a process for forming the multi-layer printed circuit board is shortened. Thus, the manufacturing cost becomes small.

However, when the surface roughness of the conductive pattern becomes small in order to improve the high frequency properties, the conductive pattern exposed on the surface of the multi-layer printed circuit board easily peels off.

SUMMARY OF THE INVENTION

In view of the above-described problem, it is an object of the present invention to provide a multi-layer printed circuit board and a method for manufacturing the same. The manufacturing cost of the multi-layer printed circuit board is small, and a conductive pattern of the multi-layer printed circuit board is prevented from peeling off. Further, the multi-layer printed circuit board is suitable for providing a high frequency circuit.

The multi-layer printed circuit board according to a preferred embodiment of the present invention includes an insulation substrate made of insulation material, a surface conductive pattern and an inner conductive pattern. The surface conductive pattern is disposed on the surface of the insulation substrate. The inner conductive pattern is embedded in the insulation substrate. The surface conductive pattern has a large surface roughness on the insulation substrate side. The surface roughness of the surface conductive pattern is larger than that of the inner conductive pattern.

In the multi-layer printed circuit board, the surface roughness of the surface conductive pattern on the insulation substrate side is set to be large in order to increase adhesive strength so that the surface conductive pattern exposed on the surface of the multi-layer printed circuit board does not peel off easily. On the other hand, although the surface roughness of the inner conductive pattern is smaller than that of the surface conductive pattern on the insulation substrate side, an external force for peeling off the inner conductive pattern does not apply to the inner conductive pattern. That is because the inner conductive pattern is embedded in the multi-layer printed circuit board. Thus, the multi-layer printed circuit board has the surface and inner conductive patterns prevented from peeling off.

Preferably, the inner conductive pattern includes a high frequency conductive pattern for providing a high frequency circuit. In this case, the surface roughness of the inner conductive pattern is set to be smaller than that of the surface conductive pattern on the insulation substrate side. Therefore, the surface resistance of the inner conductive pattern is smaller than that of the surface conductive pattern, so that the inner conductive pattern has excellent properties as a conductive wire for flowing a high frequency alternating current, which is superior to the surface conductive pattern. Accordingly, the multi-layer printed circuit board having the inner conductive pattern used as the high frequency conductive pattern is suitable for providing the high frequency circuit.

Preferably, the high frequency conductive pattern is a strip line having a strip-shaped conductive pattern and a pair of wide grounding conductive patterns. The strip-shaped conductive pattern is sandwiched by the wide grounding conductive patterns through the insulation material of the insulation substrate in the thickness direction of the insulation substrate. More preferably, each grounding conductive pattern has a surface roughness disposed on the facing surface of the grounding conductive pattern facing each other and another surface roughness disposed on the opposite side, respectively. The surface roughness on the facing surface side is smaller than the other surface roughness on the opposite side. In this case, a high frequency signal is transmitted between the strip-shaped conductive pattern and the grounding conductive patterns disposed on both sides of the strip-shaped conductive pattern. Therefore, the high frequency alternating current having high frequency flows near the surface of each of the strip-shaped conductive pattern and the grounding conductive patterns. Accordingly, the multi-layer printed circuit board having the inner conductive pattern provided by the strip line is suitable for providing the high frequency circuit. Specifically, since the strip line includes the grounding conductive patterns having a small surface roughness on the facing surface side, the strip line has a small surface resistance against the high frequency alternating current compared with a strip line with a grounding conductive pattern having a normal surface roughness.

Preferably, the high frequency conductive pattern is a micro strip line having a strip-shaped conductive pattern and a wide grounding conductive pattern. The strip-shaped conductive pattern is disposed on the wide grounding conductive pattern through the insulation material of the insulation substrate in the thickness direction of the insulation substrate. More preferably, each of the grounding conductive pattern and the strip-shaped conductive pattern has a surface roughness disposed on the facing surface of the grounding conductive pattern or the strip-shaped conductive pattern facing each other and another surface roughness disposed on the opposite side, respectively. The surface roughness on the facing surface side is smaller than the other surface roughness on the opposite side. In this case, a high frequency signal is transmitted between the strip-shaped conductive pattern and the grounding conductive pattern in the micro strip line similar to the above strip line. Therefore, the high frequency alternating current having high frequency flows near the surface of each of the strip-shaped conductive pattern and the grounding conductive pattern. Accordingly, the multi-layer printed circuit board having the inner conductive pattern provided by the micro strip line is suitable for providing the high frequency circuit. Specifically, since the micro strip line includes the grounding conductive pattern and the strip-shaped conductive pattern having a small surface roughness on the facing surface side, respectively, the micro strip line has a small surface resistance against the high frequency alternating current compared with a micro strip line with a grounding conductive pattern and a strip-shaped conductive pattern having a normal surface roughness, respectively.

The method for manufacturing a multi-layer printed circuit board according to a preferred embodiment of the present invention includes the steps of: preparing a strip-shaped conductive pattern film by forming a strip-shaped conductive pattern made of metallic film on a resin film made of thermoplastic resin; preparing a pair of grounding conductive pattern films by forming a wide grounding conductive pattern made of metallic film on a resin film made of thermoplastic resin; preparing a spacer film including a resin film made of thermoplastic resin without any conductive pattern disposed on a part of the surface of the resin film, the part corresponding to the grounding conductive pattern; laminating the strip-shaped conductive pattern film, the spacer film and the grounding conductive pattern films in such a manner that a pair of grounding conductive pattern films is arranged to face the grounding conductive patterns of the ground conductive pattern films together so that each surface of the grounding conductive pattern film disposing the grounding conductive pattern faces inside, the spacer film is laminated on the surface of the strip-shaped conductive pattern film disposing the strip-shaped conductive pattern of the strip-shaped conductive pattern film, and the laminates of the strip-shaped conductive pattern film and the spacer film are inserted between a pair of the grounding conductive pattern films so that the grounding conductive pattern films are disposed on both sides of the strip-shaped conductive pattern film through the resin film; bonding each resin film together by heating and pressurizing the laminates of the strip-shaped conductive pattern film , the spacer film and the grounding conductive pattern films.

The method provides to manufacture the multi-layer printed circuit board having the conductive patterns disposed on the surface of the circuit board and/or disposed inside of the circuit board. The conductive patterns are prevented from peeling off. Further, when the inner conductive pattern of the multi-layer printed circuit board is used for the high frequency conductive pattern, the multi-layer printed circuit board is suitable for providing the high frequency circuit.

Further, another method for manufacturing a multi-layer printed circuit board according to a preferred embodiment of the present invention includes the steps of: preparing a strip-shaped conductive pattern film by forming a strip-shaped conductive pattern made of metallic film on a resin film made of thermoplastic resin; preparing a grounding conductive pattern film by forming a wide grounding conductive pattern made of metallic film on a resin film made of thermoplastic resin; preparing a spacer film including a resin film made of thermoplastic resin without any conductive pattern disposed on a part of the surface of the resin film, the part corresponding to the grounding conductive pattern; laminating the strip-shaped conductive pattern film, the spacer film and the grounding conductive pattern film in such a manner that the grounding conductive pattern film and the strip-shaped conductive pattern film are arranged to face the grounding conductive pattern of the ground conductive pattern film and the strip-shaped conductive pattern of the strip-shaped conductive pattern film together so that each surface of the grounding conductive pattern film disposing the grounding conductive pattern and the surface of the strip-shaped conductive pattern film disposing the strip-shaped conductive pattern faces inside, the spacer film is inserted between the strip-shaped conductive pattern film and the grounding conductive pattern film so that the grounding conductive pattern film is disposed on one side of the strip-shaped conductive pattern film through the resin film; bonding each resin film together by heating and pressurizing the laminates of the strip-shaped conductive pattern film, the spacer film and the grounding conductive pattern film.

The method provides to manufacture the multi-layer printed circuit board having the conductive patterns disposed on the surface of the circuit board and/or disposed inside of the circuit board. The conductive patterns are prevented from peeling off. Further, when the inner conductive pattern of the multi-layer printed circuit board is used for the high frequency conductive pattern, the multi-layer printed circuit board is suitable for providing the high frequency circuit.

DETAILED DESCRIPTION OF THE PREFERRED EMBODIMENT

Figure 1A:
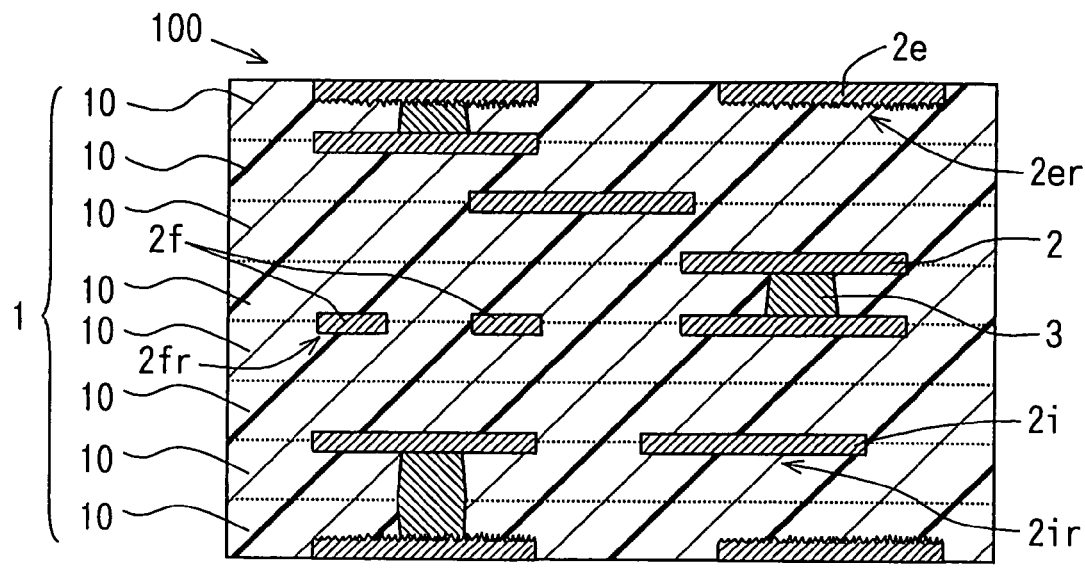
FIG. 1A is a schematic cross sectional view showing a multi-layer printed circuit board.
Figure 1B:
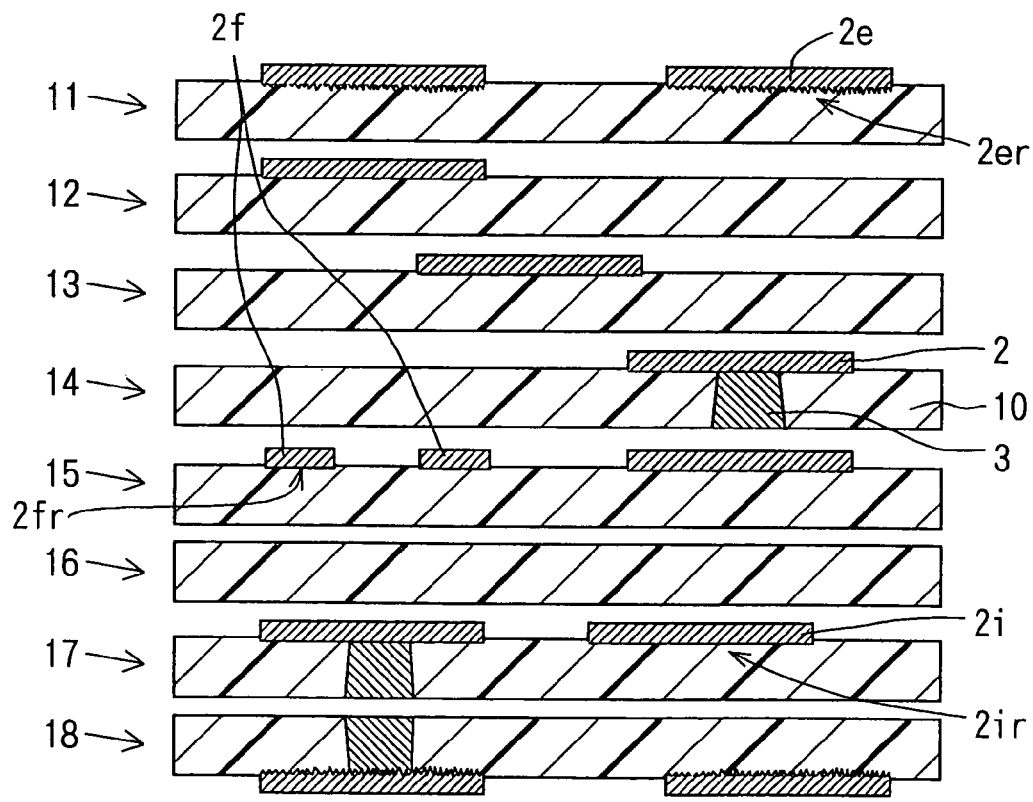
FIG. 1B is a cross sectional view explaining a laminating state of each constituent element in process of manufacturing the multi-layer printed circuit board, according to a preferred embodiment of the present invention.

A multi-layer printed circuit board 100 according to a preferred embodiment of the present invention is shown in FIG. 1A. FIG. 1B explains a laminating state of each constituent element in process of manufacturing the multi-layer printed circuit board 100.

The multi-layer printed circuit board 100 shown in FIG. 1A includes an insulation substrate 1 made of thermoplastic resin and a wiring layer for providing a conductive pattern 2 made of metallic film. Specifically, the multi-layer printed circuit board 100 includes, for example, eight conductive pattern films 11-18 laminated and bonded together, as shown in FIG. 1B. Each conductive pattern film 11-18 includes a resin film 10 made of thermoplastic resin and the conductive pattern 2. The conductive pattern 2 made of metallic film has a predetermined pattern, and is disposed on the resin film 10. The thermoplastic resin for providing the insulation substrate 1 shown in FIG. 1A and the resin film 10 composing the insulation film 1 shown in FIG. 1B are, for example, a liquid crystal polymer (i.e., LCP) and the like. The metallic film for providing the conductive pattern 2 is a copper foil and the like. Here, a conductive material member 3 is filled in a hole disposed in the insulation substrate 1, as shown in FIG. 1A. The conductive material member 3 connects between the conductive patterns 2 disposed on different layers, respectively.

As shown in FIG. 1B, the multi-layer printed circuit board 100 includes a surface conductive pattern 2e and an inner conductive pattern 2i. The surface conductive pattern 2e is exposed on the surface of the multi-layer printed circuit board, and has a surface roughness 2er on the insulation substrate 1 side. The inner conductive pattern 2i is embedded in the multi-layer printed circuit board 100, and has a surface roughness 2ir. The surface roughness 2er of the surface conductive pattern 2e is larger than the surface roughness 2ir of the inner conductive pattern 2i. Thus, the surface roughness 2er of the surface conductive pattern 2e on the insulation substrate 1 side is set to be larger in order to increase the adhesion strength. Therefore, the surface conductive pattern 2e is prevented from peeling off although the surface conductive pattern 2e is exposed on the surface of the multi-layer printed circuit board 100, as shown in FIG. 1A. On the other hand, the surface roughness 2ir of the inner conductive pattern 2i is smaller than the surface roughness 2er of the surface conductive pattern 2e on the insulation substrate 1 side. However, since the inner conductive pattern 2i is embedded in the insulation substrate 1 of the multi-layer printed circuit board 100, an outside force for peeling off the inner conductive pattern 2i does not apply to the inner conductive pattern 2i. Accordingly, the multi-layer printed circuit board 100 includes conductive patterns 2 disposed on the surface of the multi-layer printed circuit board 100 and disposed in the circuit board 100, the conductive patterns 2 being prevented from peeling off.

In the multi-layer printed circuit board 100 shown in FIG. 1A, the inner conductive pattern $2f$ is a high frequency conductive pattern $2f$ for providing a high frequency circuit. On the other hand, other conductive patterns 2i are normal frequency conductive patterns for transmitting a low frequency signal having a low frequency lower than that of the high frequency conductive pattern $2f$. The surface roughness $2fr$, $2ir$ of the inner conductive pattern $2f$, $2i$ is set to be smaller than the surface roughness 2er of the surface conductive pattern 2e on the insulation substrate 1 side. Therefore, the surface resistance of the inner conductive pattern $2f$, $2i$ is smaller than that of the surface conductive pattern 2e, so that the inner conductive pattern $2f$, $2i$ as a conductive wiring for flowing the high frequency alternating current is superior to the surface conductive pattern 2e. Accordingly, the multi-layer printed circuit board 100 shown in FIG. 1A includes the inner conductive pattern $2f$ having the small surface resistance for providing the high frequency conductive pattern $2f$, so that the multi-layer printed circuit board 100 is suitable for providing the high frequency circuit.

The multi-layer printed circuit board 100 shown in FIG. 1A is manufactured as follows.

At first, the conductive pattern 2 having a predetermined pattern is formed on the resin film 10 made of thermoplastic resin so that each conductive pattern film 11-18 is prepared. The conductive pattern 2 is made of a metallic film. Next, a hole having a bottom is formed in the resin film 10 by a laser beam drilling method. The bottom of the hole is the conductive pattern 2. A conductive paste is filled in the hole having the bottom. The conductive paste filled in the hole having the bottom is sintered so that the conductive material member 3 is formed, as shown in FIG. 1A. Thus, the conductive pattern films 11-18 are prepared.

Next, the conductive pattern films 11-18 prepared in the above process are laminated such that the conductive pattern films 11-18 have a certain arrangement and a certain orientation, as shown in FIG. 1B.

Figure 2:
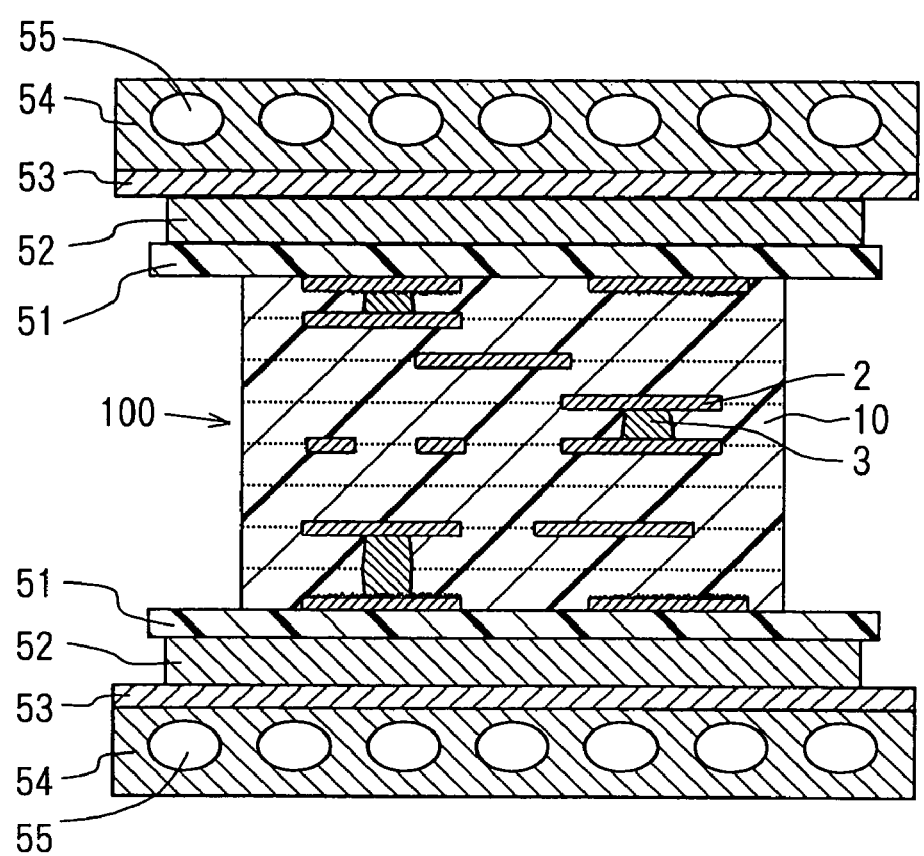
FIG. 2 is a schematic cross sectional view explaining a bonding process for heating and pressurizing in the manufacturing process of the multi-layer printed circuit board.

Next, the laminated conductive pattern films 11-18 shown in FIG. 1B are mounted between a pair of hot press plates 54 through an adhesion protection film 51, a buffer 52 and a metal plate 53, as shown in FIG. 2. A heater 55 is embedded in the hot press plates 54. Thus, the laminated conductive pattern films 11-18 are heated and pressurized so that the conductive pattern films 11-18 are bonded together at the same time. Further, the conductive paste in the hole is sintered.

Here, the adhesion protection film 51 shown in FIG. 2 prevents the resin film 10 from adhering to other part disposed around the resin film 10 in case of heating and pressurizing. Further, the adhesion protection film 51 protects the resin film 10 and the conductive pattern 2 from being damaged. The adhesion protection film 51 is made of, for example, poly-imide film or the like. The buffer 52 works for pressurizing the laminated conductive pattern films 11-18 uniformly. The buffer 52 is made of, for example, fibrous metal, which is formed by cutting a metal such as stainless steel and the like. The metal plate 53 prevents the hot press plate 54 from being damaged. The metal plate 53 is made of, for example, stainless steel (i.e., SUS), titanium (i.e., Ti) or the like. Here, a laminating order of the buffer 52 and the metal plate 53 shown in FIG. 2 may be reversed.

Thus, the heated and pressurized laminated conductive pattern films 11-18 are retrieved from the hot press plate 54, so that the multi-layer printed circuit board 100 shown in FIG. 1A is completed.

In the above method for manufacturing the multi-layer printed circuit board 100, since the laminated conductive pattern films 11-18 are bonded together at the same time, a process for forming the multi-layer printed circuit board 100 is shortened. Therefore, the manufacturing cost of the multi-layer printed circuit board 100 becomes small.

Other multi-layer printed circuit boards 101, 102 according to the preferred embodiment of the present invention are shown in FIGS. 3A, 3B, 4A and 4B.

Figure 3A:
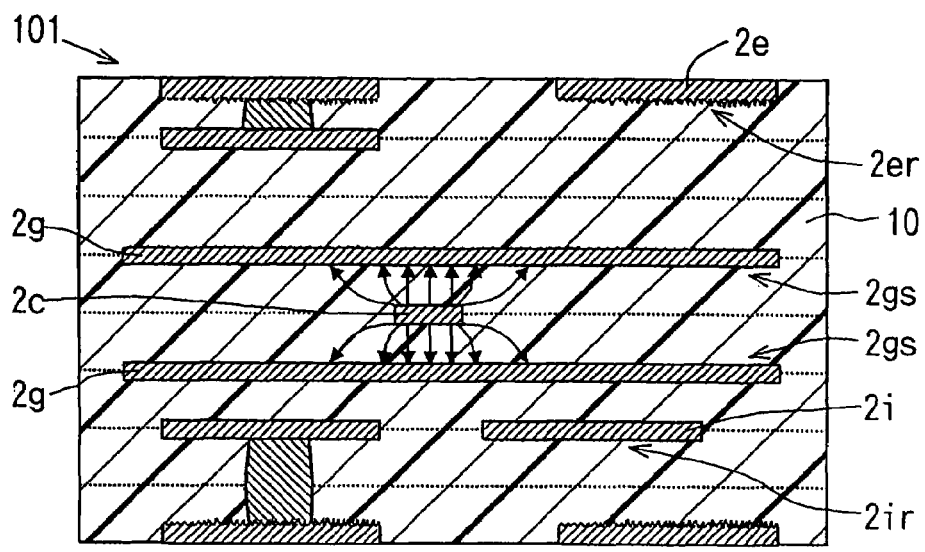
FIG. 3A is a schematic cross sectional view showing a multi-layer printed circuit board having a high frequency conductive pattern provided by a strip line.
Figure 3B:
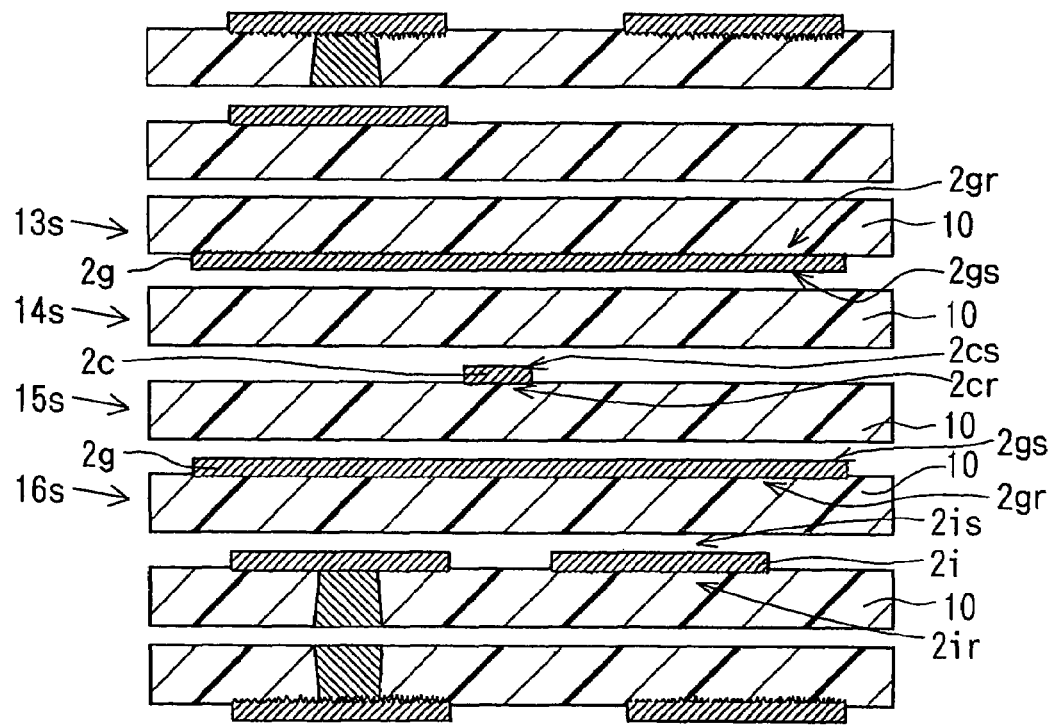
FIG. 3B is a cross sectional view explaining a laminating state of each constituent element in process of manufacturing the multi-layer printed circuit board, according to another preferred embodiment of the present invention.

FIG. 3A is a schematic cross sectional view showing the multi-layer printed circuit board 101. FIG. 3B explains a laminating state of each constituent element in process of manufacturing the multi-layer printed circuit board 101.

As shown in FIG. 3A, a strip line has a construction such that a pair of wide grounding conductive pattern 2g is disposed on both sides of a strip-shaped conductive pattern 2c through the insulation material of the insulation substrate 1 in a laminating direction. In the strip line, a high frequency signal is transmitted between the strip-shaped conductive pattern 2c and the grounding conductive patterns 2g disposed on both sides thereof. In FIG. 3A, arrows show electric field generated by the high frequency signal transmitted in the strip line. A high frequency alternating current having a high frequency flows in accordance with the transmission of the high frequency signal near the surface of each of the stripe-shaped conductive pattern 2c and the grounding conductive patterns 2g, which faces each other.

In the multi-layer printed circuit board 101 shown in FIG. 3A, the strip line including the strip-shaped conductive pattern 2c and the grounding conductive patterns 2g is formed as the inner conductive pattern. As described above, the surface roughness 2cr, 2gr of the inner conductive pattern 2c, 2g is set to be smaller than the surface roughness 2er of the surface conductive pattern 2e on the insulation substrate 1 side. Therefore, the strip-shaped conductive pattern 2c and the grounding conductive patterns 2g as the inner conductive pattern 2 have the surface resistance, which is smaller than that of the surface conductive pattern 2e. Accordingly, the multi-layer printed circuit board 101 having the strip line provided by the inner conductive pattern 2c, 2g shown in FIG. 3A is suitable for providing the high frequency circuit.

The strip line of the multi-layer printed circuit board 101 is manufactured as follows.

The conductive pattern 2c having a strip shape made of metallic film is formed on the resin film 10 made of thermoplastic resin so that the strip-shaped conductive pattern film 15s is prepared, as shown in FIG. 3B. The wide grounding conductive pattern 2g made of metallic film is formed on the resin film 10 made of thermoplastic resin so that the grounding conductive pattern film 13s, 16s is prepared, as shown in FIG. 3B. The spacer film 14s is prepared such that the spacer film 14s is formed of the resin film 10 made of thermoplastic resin without any conductive pattern disposed on a part of the surface of the resin film 10, the part corresponding to the grounding conductive pattern 2g (i.e., the spacer film 14s has no conductive pattern disposed on the part corresponding to the grounding conductive pattern 2g).

Next, as shown in FIG. 3B, a pair of the grounding conductive pattern films 13s, 16s is arranged to face the grounding conductive patterns 2g of the ground conductive pattern films 13s, 16s together so that each surface of the grounding conductive pattern film 13s, 16s disposing the grounding conductive pattern 2g faces inside. Further, the spacer film 14s is laminated on the surface of the strip-shaped conductive pattern film 15s disposing the strip-shaped conductive pattern 2c of the strip-shaped conductive pattern film 15s. Then, the laminates of the strip-shaped conductive pattern film 15s and the spacer film 14s are inserted between a pair of the grounding conductive pattern films 13s, 16s so that the grounding conductive patterns 2g are disposed on both sides of the strip-shaped conductive pattern 2c through the resin film 10.

The laminates of the strip-shaped conductive pattern film 15s, the spacer film 14s and the grounding conductive pattern films 13s, 16s shown in FIG. 3B are heated and pressurized by the hot press plate so that each resin film 10 is bonded together. Thus, the multi-layer printed circuit board 101 having the strip line shown in FIG. 3A is completed.

The conductive pattern 2i as a constituent element of the multi-layer printed circuit board has the surface roughness 2ir on the resin film 10 side, the surface roughness 2ir being set to be larger than the surface roughness 2is on the opposite side of the resin film 10 in general in order to secure the adhesion strength between the resin film 10 and the conductive pattern 2i. Thus, the strip line shown in FIG. 3A is provided by a pair of grounding conductive patterns 2g in such a manner that one surface of each grounding conductive pattern 2g, which is disposed on the small surface roughness 2gs side, faces each other. Therefore, the strip line shown in FIG. 3A has the small surface resistance compared with other strip lines having other laminating arrangements. Accordingly, the multi-layer printed circuit board 101 shown in FIG. 3A is particularly suitable for providing the high frequency circuit.

Figure 4A:
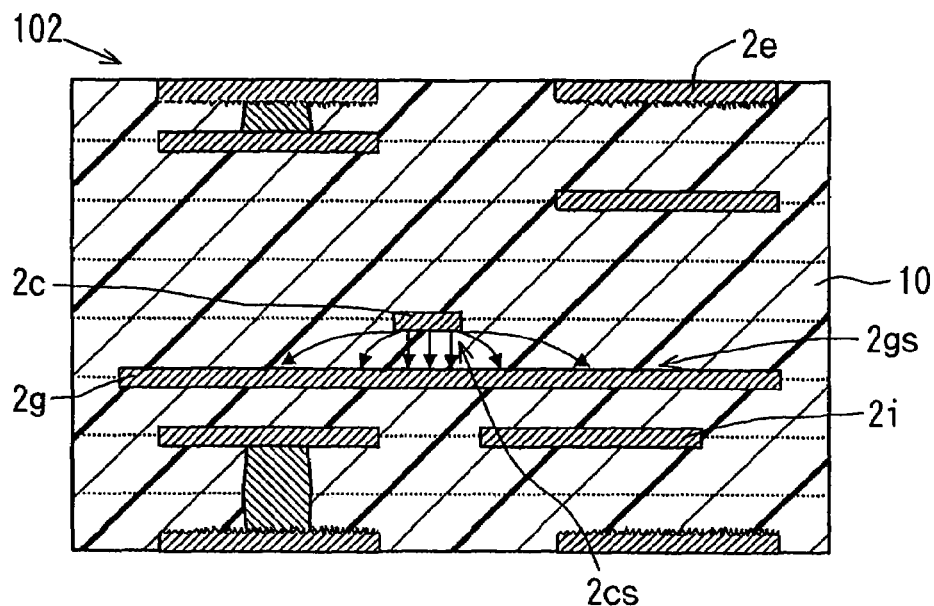
FIG. 4A is a schematic cross sectional view showing a multi-layer printed circuit board having a high frequency conductive pattern provided by a micro strip line.
Figure 4B:
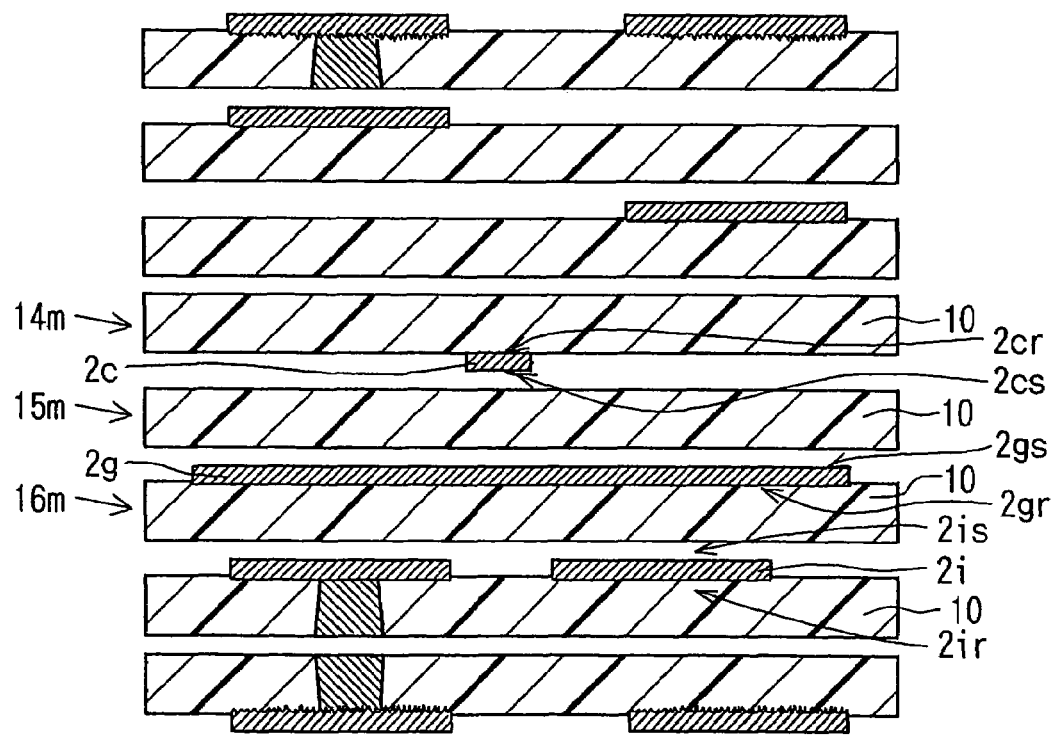
FIG. 4B is a cross sectional view explaining a laminating state of each constituent element in process of manufacturing the multi-layer printed circuit board, according to further another preferred embodiment of the present invention.

FIG. 4A shows further another multi-layer printed circuit board 102 having a micro strip line provided by the high frequency conductive patterns. FIG. 4A is a schematic cross sectional view showing the multi-layer printed circuit board 102. FIG. 4B explains a laminating state of each constituent element in process of manufacturing the multi-layer printed circuit board 102.

As shown in FIG. 4A, the micro strip line has a construction such that the wide grounding conductive pattern 2g is disposed on one side of the strip-shaped conductive pattern 2c through the insulation material of the insulation substrate 1 in the laminating direction. In the micro strip line, a high frequency signal is transmitted between the strip-shaped conductive pattern 2c and the grounding conductive pattern 2g, which is similar to the strip line in the multi-layer printed circuit board 101. In FIG. 4A, arrows show electric field generated by the high frequency signal transmitted in the micro strip line. A high frequency alternating current having a high frequency flows in accordance with the transmission of the high frequency signal near the surface of each of the stripe-shaped conductive pattern 2c and the grounding conductive pattern 2g, which faces each other.

In the multi-layer printed circuit board 102 shown in FIG. 4A, the micro strip line including the strip-shaped conductive pattern 2c and the grounding conductive pattern 2g is formed as the inner conductive pattern 2. As described above, the surface roughness 2ir of the inner conductive pattern 2i on the resin film 10 side is set to be smaller than the surface roughness 2er of the surface conductive pattern 2e on the insulation substrate 1 side. Therefore, the surface resistance of the inner conductive pattern 2i is small. Accordingly, the multi-layer printed circuit board 102 having the micro strip line provided by the inner conductive pattern 2i shown in FIG. 4A is suitable for providing the high frequency circuit.

The micro strip line of the multi-layer printed circuit board 102 is manufactured as follows.

Similar to the method for manufacturing the strip line of the multi-layer printed circuit board 101 shown in FIG. 3B, at first, the strip-shaped conductive pattern film 14m, the spacer film 15m and the grounding conductive pattern film 16m are prepared.

Then, the strip-shaped conductive pattern film 14m and the grounding conductive pattern film 16m are arranged to face the grounding conductive pattern 2g of the ground conductive pattern film 16m and the strip-shaped conductive pattern 2c of the strip-shaped conductive pattern film 14m each other so that each surface of the grounding conductive pattern film 16m disposing the grounding conductive pattern 2g and the strip-shaped conductive pattern film 14m disposing the strip-shaped conductive pattern 2c faces inside. Further, the spacer film 14s is inserted between the strip-shaped conductive pattern film 14m and the grounding conductive pattern film 16m so that the grounding conductive pattern 2g is disposed on one side of the strip-shaped conductive pattern 2c through the resin film 10.

Then, the laminates of the strip-shaped conductive pattern film 14m, the spacer film 15m and the grounding conductive pattern film 16m are heated and pressurized by the hot press plate so that each resin film 10 is bonded together. Thus, the multi-layer printed circuit board 102 having the micro strip line shown in FIG. 4A is completed.

The conductive pattern 2i as a constituent element of the multi-layer printed circuit board 102 has the surface roughness 2ir on the resin film 10 side, the surface roughness 2ir being set to be larger than the surface roughness 2is on the opposite side of the resin film 10 in general in order to secure the adhesion strength between the resin film 10 and the conductive pattern 2i. Thus, the micro strip line shown in FIG. 4A is provided by the grounding conductive pattern 2g and the strip-shaped conductive pattern 2c in such a manner that one surface of the grounding conductive pattern 2g, which is disposed on the small surface roughness 2gs side, faces one surface of the strip-shaped conductive pattern 2c, which is disposed on the small surface roughness 2cs side. Therefore, the micro strip line shown in FIG. 4A has the small surface resistance compared with other micro strip lines having other laminating arrangements. Accordingly, the multi-layer printed circuit board 102 shown in FIG. 4A is particularly suitable for providing the high frequency circuit.

Thus, the above multi-layer printed circuit boards 100-102 are manufactured at a low cost, and the conductive pattern in them 100-102 are prevented from peeling off. Further, they 100-102 are suitable for providing the high frequency circuit.

What is claimed is:

1. A method for manufacturing a multi-layer printed circuit board, the method comprising the steps of:
   preparing a strip-shaped conductive pattern film by forming a strip-shaped conductive pattern made of metallic film on a resin film made of thermoplastic resin;
   preparing a pair of grounding conductive pattern films each of grounding conductive pattern film formed by a wide grounding conductive pattern made of metallic film on a resin film made of thermoplastic resin;
   preparing a spacer film including a resin film made of thermoplastic resin without any conductive pattern disposed on a part of the surface of the resin film of the spacer film, the part corresponding to the grounding conductive pattern;
   preparing at least one surface conductive film by forming a surface conductive pattern made of metallic film on a resin film made of a thermoplastic resin;
   laminating the strip-shaped conductive pattern film, the spacer film and the grounding conductive pattern films in such a manner that:
      the pair of grounding conductive pattern films is arranged so that one grounding conductive pattern of one of the pair of grounding conductive pattern films faces the other grounding conductive pattern of the other one of the pair of grounding conductive films,
      the spacer film is laminated on the surface of the strip-shaped conductive pattern of the strip-shaped conductive pattern film,
      the laminates of the strip-shaped conductive pattern film and the spacer film are inserted between the pair of the grounding conductive pattern films so that the grounding conductive pattern films are disposed on both sides of the strip-shaped conductive pattern film through the resin films of the strip-shaped conductive pattern film and the spacer film, and
      the laminates of the strip-shaped conductive pattern film, the spacer film, and the grounding conductive pattern films are laminated to the surface conductive film where the surface conductive pattern faces outwardly;
   bonding each resin film together by heating and pressurizing the laminates of the surface conductive film, the strip-shaped conductive pattern film, the spacer film and the grounding conductive pattern films,
   wherein each grounding conductive pattern and strip-shaped conductive pattern provide a high-frequency conductive pattern for providing a high frequency circuit, and
   wherein each of the grounding conductive patterns and strip-shaped conductive pattern has a surface roughness, which is smaller than a surface roughness of the surface conductive pattern on a resin film side, disposed on an outer surface of the multi-layer printed circuit board.

2. A method for manufacturing a multi-layer printed circuit board, the method comprising the steps of:
   preparing a strip-shaped conductive pattern film by forming a strip-shaped conductive pattern made of metallic film on a resin film made of thermoplastic resin;
   preparing a pair of grounding conductive pattern films each of grounding conductive pattern film formed by a wide grounding conductive pattern made of metallic film on a resin film made of thermoplastic resin;

preparing a spacer film including a resin film made of thermoplastic resin without any conductive pattern disposed on a part of a surface of the resin film corresponding to the grounding conductive pattern when laminated therewith;

preparing a surface conductive film by forming a surface conductive pattern made of metallic film on a resin film made of a thermoplastic resin;

laminating the surface conductive film, the strip-shaped conductive pattern film, the spacer film, and the grounding conductive pattern films in the following order:

one of the pair of grounding conductive pattern films with the grounding conductive pattern film facing the spacer film;

the spacer film;

the strip-shape conductive film, the strip-shaped conductive pattern of the strip-shape conductive film being arranged between the spacer and strip-shape conductive films; and another one of the pair of grounding conductive pattern films with the grounding conductive pattern film facing the resin film of the strip-shape conductive film; and surface conductive film with the surface conductive pattern facing outward; and bonding the resin films together by heating and pressurizing, thereby forming the multi-layer printed circuit board, wherein each grounding conductive pattern and strip-shaped conductive pattern provide a high-frequency conductive pattern for providing a high frequency circuit, and wherein each of the grounding conductive patterns and strip-shaped conductive pattern has a surface roughness, which is smaller than a surface roughness of the surface conductive pattern on a resin film side, disposed on an outer surface of the multi-layer printed circuit board.

3. A method for manufacturing a multi-layer printed circuit board, the method comprising the steps of:

preparing pattern films, each of pattern film having a conductive metallic film on a resin film made of thermoplastic resin, the pattern films including:

a strip-shaped conductive pattern film with a strip-shaped conductive pattern, a pair of grounding conductive patterns film with grounding conductive patterns, and a surface conductive film with a surface conductive pattern;

pressurizing, thereby forming the multi-layer printed circuit board, preparing a spacer film of the resin film made of thermoplastic resin;

arranging the films in an order including one of the pair of grounding conductive patterns, the strip-shaped conductive pattern, the spacer film, another one of the pair of grounding conductive patterns, and the surface conductive pattern; the films being arranged with the resin films of thermoplastic resin interposed between each of the pattern films of conductive metal;

bonding the resin films together by heating and pressurizing, wherein each grounding conductive pattern and strip-shaped conductive pattern provide a high-frequency conductive pattern for providing a high frequency circuit, and wherein each of the grounding conductive patterns and strip-shaped conductive pattern has a surface roughness, which is smaller than a surface roughness of the surface conductive pattern on a resin film side, disposed on an outer surface of the multi-layer printed circuit board.

* * * * *